(12) United States Patent
Off et al.

(10) Patent No.: US 9,786,498 B2
(45) Date of Patent: Oct. 10, 2017

(54) METHOD FOR THE PRODUCTION OF A NITRIDE COMPOUND SEMICONDUCTOR LAYER

(71) Applicant: OSRAM Opto Semiconductors GmbH, Regensburg (DE)

(72) Inventors: Juergen Off, Regensburg (DE); Matthias Peter, Regensburg (DE); Thomas Lehnhardt, Regensburg (DE); Werner Bergbauer, Windberg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/119,703

(22) PCT Filed: Feb. 12, 2015

(86) PCT No.: PCT/EP2015/053004
§ 371 (c)(1),
(2) Date: Aug. 17, 2016

(87) PCT Pub. No.: WO2015/124495
PCT Pub. Date: Aug. 27, 2015

(65) Prior Publication Data
US 2017/0053795 A1 Feb. 23, 2017

(30) Foreign Application Priority Data
Feb. 18, 2014 (DE) .......................... 10 2014 102 039

(51) Int. Cl.
| | |
|---|---|
| *H01L 21/20* | (2006.01) |
| *H01L 21/36* | (2006.01) |
| *H01L 21/02* | (2006.01) |
| *C30B 25/18* | (2006.01) |
| *C30B 29/40* | (2006.01) |

(52) U.S. Cl.
CPC ........ *H01L 21/0254* (2013.01); *C30B 25/183* (2013.01); *C30B 29/403* (2013.01); *C30B 29/406* (2013.01); *H01L 21/0242* (2013.01); *H01L 21/02458* (2013.01); *H01L 21/02645* (2013.01); *H01L 21/02658* (2013.01)

(58) Field of Classification Search
None
See application file for complete search history.

(56) References Cited

U.S. PATENT DOCUMENTS

| | | |
|---|---|---|
| 2004/0016396 A1 | 1/2004 | Nagai et al. |
| 2010/0273290 A1 | 10/2010 | Kryliouk |

FOREIGN PATENT DOCUMENTS

| | | |
|---|---|---|
| WO | 2011032546 A1 | 3/2011 |

OTHER PUBLICATIONS

Chen, J. J., et al., "Enhanced Output Power of GaN-Based LEDs with Nano-Patterned Sapphire Substrates", IEEE Photonics Technology Letters, vol. 20, No. 13, Jul. 1, 2008, pp. 1193-1195.

Kim, J. H. et al., "Effects of Initial Thermal Cleaning Treatment of a Sapphire Substrate Surface on the GaN Epilayer", Japanese Journal of Applied Physics, vol. 38, No. 5A, May 1999, pp. 2721-2724.

Koblmueller, G. et al., "Delayed Nucleation During Molecular-Beam Epitaxial Growth of GaN Observed by Line-of-Sight Quadrupole Mass Spectrometry", Appl. Phys. Letters, vol. 80, No. 13. Apr. 1, 2002, pp. 2281-2283.

Koleske, D. D., et al., "Nanostructural Engineering of Nitride Nucleation Layers for GaN Substrate Dislocation Reduction", Sandia Report SAND2009-4440, Sandia National Laboratories, Jul. 2009, 41 pgs.

*Primary Examiner* — Calvin Choi
(74) *Attorney, Agent, or Firm* — McDermott Will & Emery LLP

(57) ABSTRACT

Described is a method for producing a nitride compound semiconductor layer, involving the steps of:—depositing a first seed layer (1) comprising a nitride compound semiconductor material on a substrate (10);—desorbing at least some of the nitride compound semiconductor material in the first seed layer from the substrate (10);—depositing a second seed layer (2) comprising a nitride compound semiconductor material; and—growing the nitride compound semiconductor layer (3) containing a nitride compound semiconductor material onto the second seed layer (2).

8 Claims, 2 Drawing Sheets

Figure 2:
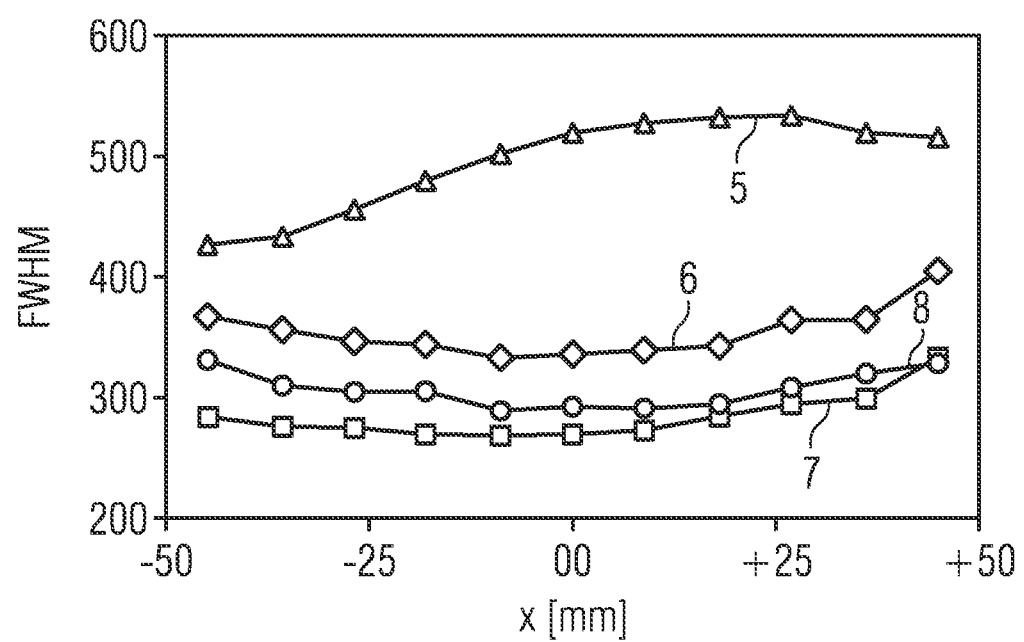

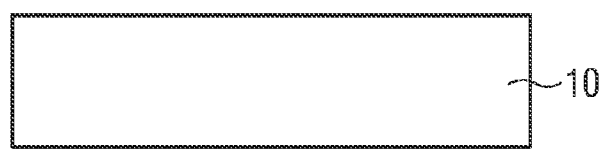
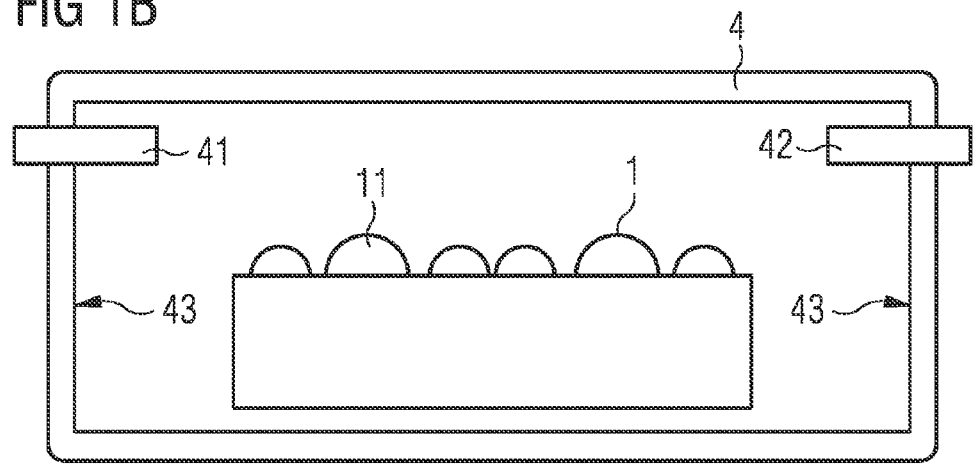
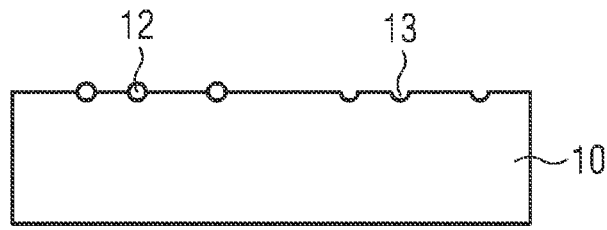
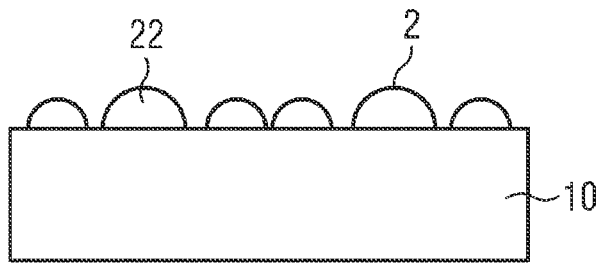
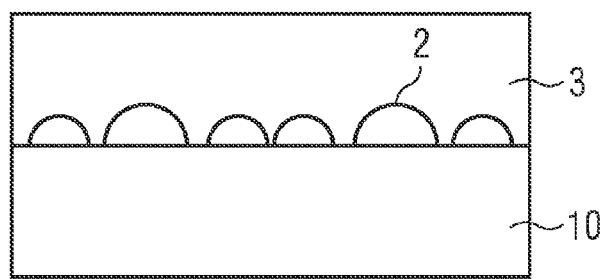

METHOD FOR THE PRODUCTION OF A NITRIDE COMPOUND SEMICONDUCTOR LAYER

The invention relates to a method for the production of a nitride compound semiconductor layer, in particular a nitride compound semiconductor layer based on the material system $Al_xIn_yGa_{1-x-y}N$ with $0 \leq x \leq 1$, $0 \leq y \leq 1$ and $x+y \leq 1$.

This patent application claims priority from German patent application 102014102039.1, the disclosure content of which is hereby included by reference.

Nitride compound semiconductor layers are used in particular in electronic and optoelectronic devices, for example in LEDs or semiconductor lasers. To achieve high efficiency and good long-term stability of semiconductor devices based on nitride compound semiconductor materials, it is desirable to produce nitride compound semiconductor layers with a particularly low dislocation density.

One object to be achieved consists in providing an improved method for the production of a nitride compound semiconductor layer with which a nitride compound semiconductor layer may be produced with a particularly low dislocation density.

This object is achieved by a method for the production of a nitride compound semiconductor layer according to the independent claim. Advantageous configurations and further developments of the invention are the subject matter of the dependent claims.

According to at least one embodiment, in the method for the production of a nitride compound semiconductor layer a first seed layer comprising a nitride compound semiconductor material is deposited on a substrate. Then the nitride compound semiconductor material of the first seed layer is desorbed at least in part from the substrate. In other words, the material of the first seed layer does not remain in its entirety on the substrate, but rather leaves the substrate again, wholly or in part.

According to at least one embodiment, in a further method step a second seed layer comprising a nitride compound semiconductor material is deposited. Then a nitride compound semiconductor layer comprising a nitride compound semiconductor material is grown on the second seed layer.

The method is distinguished in particular in that, instead of one-off growth of a seed layer and subsequent growth of the nitride compound semiconductor layer, first of all the first seed layer is deposited on the substrate, which layer is then desorbed at least in part from the substrate, and in that then a second seed layer is deposited, on which in a further step the nitride compound semiconductor material of the nitride compound semiconductor layer is grown epitaxially.

It has been found that the nitride compound semiconductor layer produced in this way is distinguished by a particularly low dislocation density, wherein the dislocation density may advantageously be less at least by a factor of 2 or even at least by a factor of 4 than the dislocation density of a nitride compound semiconductor layer grown in the conventional manner with a seed layer produced in a single method step. The low dislocation density achievable with the method has the advantage that a semiconductor device produced with the nitride compound semiconductor layer displays high efficiency and improved temperature stability. In particular, it is possible to achieve an improvement in luminous efficacy with optoelectronic devices such as for example LEDs or semiconductor lasers. This may for example be due to non-radiant recombination of charge carriers possibly occurring at dislocations, which would reduce the efficiency of the optoelectronic device.

According to at least one embodiment, the substrate is a sapphire substrate. Alternatively, it is however also conceivable for the substrate to comprise another material suitable for growth of a nitride compound semiconductor, such as for example SiC, GaN or silicon.

According to one preferred embodiment, the substrate is a prepatterned substrate. In this configuration, the prepatterned substrate has a surface pattern which is formed, for example, by a two-dimensional, in particular periodic, arrangement of raised portions and/or recesses in the substrate surface. Such prepatterned substrates, which are suitable for the growth of nitride compound semiconductor layers, are known per se and are therefore not explained in greater detail.

The deposition described herein of a first seed layer and the subsequent at least partial desorption of the nitride compound semiconductor material of the first seed layer improves nucleation of the nitride compound semiconductor material when prepatterned substrates are used and advantageously has a positive effect on the stability of an optoelectronic device such as for example an LED produced with such a nitride compound semiconductor layer. It has furthermore been found that the effort required to adapt the process parameters to the characteristics of differently prepatterned substrates is comparatively low when the method described herein is used. It is therefore possible, for example, to use substrates from different substrate manufacturers, which differ from one another in the type of surface pretreatment and/or surface patterning used, while exerting comparatively little effort with regard to adaptation of the process parameters.

A further advantage of the method when prepatterned substrates are used is that nucleation on planar sub-regions is intensified relative to nucleation on three-dimensional patterns of the substrate surface. In other words, growth selectivity is increased.

The nitride compound semiconductor material of the first seed layer, the nitride compound semiconductor material of the second seed layer and/or the nitride compound semiconductor material of the nitride compound semiconductor layer preferably each comprise $Al_xIn_yGa_{1-x-y}N$ with $0 \leq x \leq 1$, $0 \leq y \leq 1$ and $x+y \leq 1$. The nitride compound semiconductor material need not necessarily have a mathematically exact composition according to the above formula. Instead, it may comprise one or more dopants and additional constituents which do not substantially modify the characteristic physical properties of the $Al_xIn_yGa_{1-x-y}N$ material. For simplicity's sake, however, the above formula includes only the fundamental constituents of the crystal lattice (Al, In, Ga, N), even if these may in part be replaced by small quantities of further substances.

It is possible for the first seed layer, the second seed layer and the nitride compound semiconductor layer in each case to comprise the same nitride compound semiconductor material. It is however alternatively also possible for the nitride compound semiconductor materials of the first seed layer, the second seed layer and/or the nitride compound semiconductor layer to differ from one another. The first seed layer, the second seed layer and/or the nitride compound semiconductor layer may in each case comprise one or more dopants, for example a p-dopant such as for example Mg or an n-dopant such as for example Si.

In the method, deposition of the first seed layer, the second seed layer and/or the nitride compound semiconductor layer may proceed by epitaxial deposition from the gas phase. In particular, deposition may proceed by MOVPE, CVD, MBE or HVPE.

In one configuration, the method is performed in a coating installation, in particular in an epitaxy reactor. In one embodiment of the method, on deposition of the first seed layer the nitride compound semiconductor material is desorbed from at least one component of the coating installation and deposited on the substrate. In this configuration, it is possible, in order to deposit the first seed layer, for the nitride compound semiconductor material not to be supplied by sources provided for epitaxial deposition but rather for nitride compound semiconductor material attached to a component of the coating installation to be desorbed and deposited on the substrate. This is possible in particular if the coating installation has already been used for the deposition of nitride compound semiconductor material prior to performing the method, such that nitride compound semiconductor material has already been deposited in the coating installation or at least one component thereof.

Desorption of the nitride compound semiconductor material from at least one component of the coating installation may in particular be achieved in that at least one of the parameters pressure, temperature and/or gas flow in the coating installation is modified. For example, an increase in the pressure in the coating installation may enable material attached to a component such as for example the walls to be desorbed and in this way deposited in particular on the substrate.

Furthermore, gas flow in the coating installation may for example be modified. For example, on deposition by MOVPE the components of the nitride compound semiconductor material are typically supplied to the coating installation in the form of gaseous compounds. In this case, laminar flow is generally desirable. A change in this flow, for example the generation of eddies, may bring about desorption of nitride compound semiconductor material contained in the coating installation.

In one preferred embodiment, at least one component of the coating installation is heated to bring about desorption of nitride compound semiconductor material from the component. In this configuration, the at least one component of the coating installation is preferably heated to a temperature of at least 900° C.

The at least one component of the coating installation, from which the nitride compound semiconductor material is desorbed on growth of the first seed layer, may in particular be a wall of the coating installation. Since coating installations for producing epitaxial layers are generally used for a plurality of successive coating operations, nitride compound semiconductor material becomes increasingly attached in particular to the walls of the vacuum coating chamber over the course of its service life, until it is removed again for example in a cleaning process. The method described herein makes use, in one configuration, of the fact that nitride compound semiconductor material already deposited on the walls and/or another component of the vacuum coating chamber may be used for deposition of the first seed layer. In this configuration, epitaxy sources which the vacuum coating chamber comprises are preferably not operated on growth of the first seed layer. It has in particular been found that in this way similarly good results may be achieved as when the first seed layer is deposited by targeted supply of the components of the nitride compound semiconductor material by epitaxy sources present in the coating installation.

The step of desorbing the nitride compound semiconductor material of the first seed layer from the substrate may proceed in particular with exposure to heat. In a preferred configuration, the substrate is heated to a temperature of at least 950° C. to desorb the material of the first seed layer.

Deposition of the second seed layer proceeds in the method preferably at a substrate temperature of between 450° C. and 850° C. inclusive. Since this is a comparatively low temperature for epitaxial growth of a nitride compound semiconductor layer, deposition of the second seed layer involves low temperature seeding.

Growth of the nitride compound semiconductor layer onto the second seed layer preferably proceeds at a substrate temperature of at least 950° C. Unlike the second seed layer, the nitride compound semiconductor layer is thus produced by high temperature growth.

The invention is explained in greater detail below with reference to exemplary embodiments in conjunction with FIGS. 1 and 2, in which:

FIGS. 1A to 1E show a schematic representation of an exemplary embodiment of the method on the basis of schematically illustrated intermediate steps, and FIG. 2 is a graph showing the full width at half maximum (FWHM) of an X-ray diffraction reflection of the nitride compound semiconductor layer produced as a function of a spatial coordinate x of the substrate for four different exemplary embodiments of the method.

In the figures identical or identically acting components are in each case provided with the same reference numerals. The components illustrated and the size ratios of the components to one another should not be regarded as to scale.

As shown in FIG. 1A, in the method a substrate 10 is provided which comprises a lattice structure suitable for growth of a nitride compound semiconductor material. The substrate 10 is preferably a sapphire substrate. Alternatively, it would be possible for the substrate for example to comprise SiC, GaN or silicon.

The substrate 10 may be a substrate with a planar surface or alternatively a prepatterned substrate, which for example comprises periodically arranged three-dimensional patterns which are grown over on growth of the nitride compound semiconductor layer.

In the intermediate step of the method shown in FIG. 1B, a first seed layer 1 has been applied to the substrate 10. The first seed layer 1 comprises a nitride compound semiconductor material, in particular $Al_xIn_yGa_{1-x-y}N$ with $0 \leq x \leq 1$, $0 \leq y \leq 1$ and $x+y \leq 1$. The first seed layer 1 may for example comprise GaN or AlN.

As may be seen in FIG. 1B, in the exemplary embodiment the first seed layer 1 has not yet grown together to yield a continuous layer, but rather comprises a plurality of islands 11, which are distributed over the surface of the substrate 10. Such island growth generally takes place in the initial stage of epitaxial growth, when the layer thickness is still very slight and uniform seeding is unfavorable from an energy standpoint. The first seed layer 1 may for example have a thickness of between 5 nm and 50 nm.

In one configuration of the method, deposition of the first seed layer 1 takes place by epitaxial deposition from the gas phase in a coating installation 4. The nitride compound semiconductor material or the components of the nitride compound semiconductor material are in this case supplied by suitable epitaxy sources 41, 42 of the coating installation 4. Suitable epitaxy methods are for example MOVPE, CVD, MBE or HVPE. The epitaxy sources 41, 42 may in particular be gas inlets, through which gases, which contain components of the nitride compound semiconductor material, are admitted to the coating installation 4.

In one alternative configuration of the method, the material for deposition of the first seed layer 1 is not supplied from epitaxy sources but rather is desorbed from at least one component 43 of the coating installation 4 in which the method is carried out. The at least one component 43 may for example be the walls of the coating installation 4.

For example, the material of the first seed layer 1 may be desorbed from walls 43 of the coating installation 4. This may in particular be brought about in that the material to be desorbed is heated on the walls 43 to a temperature of at least 900° C. Alternatively or in addition, it is possible for desorption to be brought about by modification of another process parameter, in particular the pressure or flow conditions in the coating installation 4. For example, an increase in the pressure or a modification of the gas flow, by which for example eddies are generated, may bring about intensified desorption of nitride compound semiconductor material from the at least one component 43 of the coating installation 4.

In the intermediate step shown in FIG. 1C, the nitride compound material of the first seed layer 1 is desorbed at least in part from the substrate 10. After desorption of the nitride compound semiconductor material, only residues 12 of the nitride compound semiconductor material or constituents thereof, such as for example residual GaN or Ga islands, remain on the substrate 10. It is furthermore also possible for constituents of the substrate material to be dissolved out of the surface of the substrate 10 during desorption of the nitride compound semiconductor material. This may be caused by the nitride compound semiconductor material having previously reacted chemically with the substrate material, for example in a reaction of GaN with $Al_2O_3$ of the sapphire substrate. This may bring about roughening or the formation of defects 13 on the surface of the substrate 10.

Desorption of the nitride compound semiconductor material of the first seed layer 1 from the substrate 10 may be brought about, in one embodiment, in that epitaxy sources 41, 42 used to produce the first seed layer are switched off. In this case, as a result of the lack of supply of the components for forming the nitride compound semiconductor material, under the given process conditions part of the nitride compound semiconductor material already present on the surface is desorbed from the surface once again. Alternatively or in addition, it is also possible for the substrate 10 to be heated for at least partial desorption of the nitride compound semiconductor material of the first seed layer 1, preferably to a temperature of at least 950° C.

In a subsequent intermediate step of the method shown in FIG. 1D, a second seed layer 2 is deposited. The second seed layer 2 may, in the case of complete desorption of the previously deposited first seed layer, be deposited onto the surface of the substrate 10 or, in the case of incomplete desorption of the first seed layer, be deposited onto the residues of the first seed layer and the surface of the substrate 10. Deposition of the second seed layer 2 proceeds by epitaxial deposition, in particular by means of MOVPE, CVD, MBE or HVPE. Deposition of the second seed layer preferably proceeds at a temperature of between 450° C. and 850° C., i.e. low temperature seeding takes place. The second seed layer 2 is preferably deposited with a thickness of between 2 nm and 100 nm. Like the previously applied first seed layer 1, the second seed layer 2 may also, after deposition, be an island-type layer, which comprises islands 22 which have not yet grown together to yield a continuous layer. The second seed layer 2 preferably comprises a nitride compound semiconductor material of the composition $Al_xIn_yGa_{1-x-y}N$ with $0 \leq x \leq 1$, $0 \leq y \leq 1$ and $x+y \leq 1$ and may optionally be doped with a p-dopant or an n-dopant.

In a subsequent method step shown in FIG. 1E, a nitride compound semiconductor layer 3 is grown onto the second seed layer 2. The nitride compound semiconductor layer 3 is preferably grown at a substrate temperature of at least 1050° C. Like the first seed layer 1 and the second seed layer 2, the nitride compound semiconductor layer 3 comprises a nitride compound semiconductor material with the composition $Al_xIn_yGa_{1-x-y}N$ with $0 \leq x \leq 1$, $0 \leq y \leq 1$ and $x+y \leq 1$, wherein the nitride compound semiconductor materials of the first seed layer, second seed layer and nitride compound semiconductor layer need not necessarily be identical. The nitride compound semiconductor layer 3 may be doped with a p-dopant such as for example magnesium or an n-dopant such as for example silicon.

The nitride compound semiconductor layer 3 may advantageously be used as buffer layer for growth of an epitaxial layer sequence for a semiconductor device, in particular an optoelectronic device such as for example an LED or a semiconductor laser. Because, with the method described herein, a particularly low dislocation density is achieved for the nitride compound semiconductor layer 3, better quality may be achieved for semiconductor layers grown subsequently, in particular the semiconductor layers for an optoelectronic device. The efficiency and long-term stability of the optoelectronic device may advantageously be improved in this way.

FIG. 2 plots the full width at half maximum FWHM of the (102) X-ray reflection of a nitride compound semiconductor layer as a function of a spatial coordinate x on the substrate, the nitride compound semiconductor layer being produced according to different exemplary embodiments of the method.

For curve 5, the first seed layer was produced by very slight desorption of the nitride compound semiconductor material from the walls of the coating installation, for curve 6 it was produced with greater desorption, for curve 7 it was produced with even greater desorption and for curve 8 with targeted deposition of the nitride compound semiconductor material from epitaxy sources.

The different levels of desorption of the nitride compound semiconductor material in production of the first seed layer is caused in the exemplary embodiments of curves 6, 7 and 8 by the different number of coating operations performed previously in the coating installation. Since in each coating operation nitride compound semiconductor material also becomes attached to the walls of the coating installation, desorption from the walls increases as the number of coating operations increases, until the coating installation is cleaned.

A comparison of curves 5, 6 and 7 shows that the full width at half maximum of the (102) X-ray reflection decreases with an increasing rate of desorption from the walls of the coating installation during production of the first seed layer and thus the layer quality improves. The full width at half maximum FWHM of the (102) X-ray reflection is approximately proportional to the square root of the dislocation density. Through targeted deposition of the first seed layer from epitaxy sources (curve 8), it is possible to achieve similarly low dislocation densities of the nitride compound semiconductor layers deposited thereon as by major desorption from the walls of the coating installation (curve 7).

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for the production of a nitride compound semiconductor layer, comprising the steps:
   deposition of a first seed layer comprising a nitride compound semiconductor material onto a substrate by epitaxial deposition from the gas phase using epitaxy sources;
   at least partial desorption of the nitride compound semiconductor material of the first seed layer from the substrate by switching off the epitaxial sources or by heating the substrate to at least 900° C.;
   deposition of a second seed layer comprising a nitride compound semiconductor material at a temperature of between 450° C. and 850° C.; and
   growth of the nitride compound semiconductor layer comprising a nitride compound semiconductor material onto the second seed layer.

2. The method according to claim 1, wherein the substrate is a sapphire substrate.

3. The method according to claim 1, wherein the substrate is a prepatterned substrate.

4. The method according to claim 1, wherein the nitride compound semiconductor material of the first seed layer comprises $Al_xIn_yGa_{1-x-y}N$ with $0 \leq x \leq 1$, $0 \leq y \leq 1$ and $x+y \leq 1$.

5. The method according to claim 1, wherein the nitride-compound semiconductor material of the second seed layer comprises $Al_xIn_yGa_{1-x-y}N$ with $0 \leq x \leq 1$, $0 \leq y \leq 1$ and $x+y \leq 1$.

6. The method according to claim 1, wherein the nitride compound semiconductor material of the nitride compound semiconductor layer comprises $Al_xIn_yGa_{1-x-y}N$ with $0 \leq x \leq 1$, $0 \leq y \leq 1$ and $x+y \leq 1$.

7. The method according to claim 1, wherein deposition of the first seed layer, the second seed layer and/or the nitride compound semiconductor layer proceeds by deposition from the gas phase.

8. The method according to claim 1, wherein the substrate is heated for desorption of the nitride compound semiconductor material of the first seed layer to a temperature of at least 950° C.

* * * * *